(12) United States Patent  
McCollum

(10) Patent No.: US 7,768,056 B1  
(45) Date of Patent: Aug. 3, 2010

(54) ISOLATED-NITRIDE-REGION NON-VOLATILE MEMORY CELL AND FABRICATION METHOD

(75) Inventor: John McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/152,019

(22) Filed: Jun. 13, 2005

(51) Int. Cl.
*H01L 29/94* (2006.01)

(52) U.S. Cl. .............................. 257/314; 257/E21.681

(58) Field of Classification Search ................. 257/314, 257/E21.681
See application file for complete search history.

(56) References Cited

U.S. PATENT DOCUMENTS

| | | | |
|---|---|---|---|
| 5,510,730 A | 4/1996 | El Gamal et al. | |
| 5,517,045 A * | 5/1996 | Ho et al. | 257/327 |
| 5,587,603 A | 12/1996 | Kowshik | |
| 5,625,211 A | 4/1997 | Kowshik | |
| 5,640,344 A | 6/1997 | Pani et al. | 365/182 |
| 5,740,106 A | 4/1998 | Nazarian | 365/185.1 |
| 5,847,993 A | 12/1998 | Dejenfelt | 365/185.1 |
| 6,144,580 A | 11/2000 | Murray | 365/185.01 |
| 6,356,478 B1 | 3/2002 | McCollum | 365/185.01 |
| 6,413,819 B1 * | 7/2002 | Zafar et al. | 438/257 |
| 7,355,238 B2 * | 4/2008 | Takata et al. | 257/314 |
| 7,368,789 B1 | 5/2008 | Dhaoui et al. | |
| 2004/0183126 A1 * | 9/2004 | Bae et al. | 257/324 |
| 2008/0169498 A1 | 7/2008 | Dhaoui et al. | |

* cited by examiner

*Primary Examiner*—Bradley K Smith
*Assistant Examiner*—Amar Movva
(74) *Attorney, Agent, or Firm*—Lewis and Roca LLP

(57) ABSTRACT

An isolated-nitride-region non-volatile memory cell is formed in a semiconductor substrate. Spaced-apart source and drain regions are disposed in the semiconductor substrate forming a channel therebetween. An insulating region is disposed over the semiconductor substrate. A gate is disposed over the insulating region and is horizontally aligned with the channel. A plurality of isolated nitride regions are disposed in the insulating region and are not in contact with either the channel or the gate.

8 Claims, 4 Drawing Sheets

ISOLATED-NITRIDE-REGION NON-VOLATILE MEMORY CELL AND FABRICATION METHOD

BACKGROUND OF THE INVENTION

1. Field of the Invention

The present invention relates to non-volatile memory cell technology. More particularly, the present invention relates to an isolated-nitride-region non-volatile memory cell and to fabrication methods for forming such cells.

2. The Prior Art

Non-volatile memory cells that retain data using the phenomenon of charge trapping are known. Such memory cells include metallic-nitride-oxide-semiconductor (MNOS) memory cells and silicon-oxide-nitride-oxide-silicon (SONOS) memory cells and, more recently, silicon nano-crystal memory cells.

Silicon-nano-crystal memory cells are resistant to the defects commonly seen in floating-gate memory cells, since a short between the substrate and a single nano-crystal region does not destroy the memory cell. Silicon nano-crystal memory cells suffer from a production problem in that the formation of a good quality top oxide requires an oxidation step, which tends to destroy the nano-crystals. MNOS and SONOS type memory cells have difficulty storing charge locally due to the lateral conduction of the nitride, but otherwise work in a manner similar to that of nano-crystal devices.

BRIEF DESCRIPTION OF THE INVENTION

An isolated-nitride-region non-volatile memory cell is formed in a semiconductor substrate. Spaced-apart source and drain regions are disposed in the semiconductor substrate forming a channel therebetween. An insulating region is disposed over the semiconductor substrate. A gate is disposed over the insulating region and is horizontally aligned with the channel. A plurality of isolated nitride regions, such as silicon nitride or titanium nitride regions are disposed in the insulating region and are not in contact with either the channel or the gate. Isolated regions of high-temperature conductors including metals, such as W, Ti, or doped or undoped Si or Ge may be disposed under the nitride regions.

According to another aspect of the present invention, a method is provided for fabricating an isolated-nitride-region non-volatile memory cell. A tunnel dielectric is formed on a semiconductor substrate. A layer of silicon nitride is formed over the tunnel dielectric to define a channel region. Silicon nano-crystals are formed on the layer of silicon nitride. The silicon nitride is selectively etched to form isolated silicon nitride regions using the silicon nano-crystals as a mask. The silicon nano-crystals may then be left in place or removed. A dielectric layer is formed over the isolated silicon nitride regions to encapsulate the isolated silicon nitride regions. A gate is formed over the channel region. Source and drain regions are formed in the semiconductor substrate, the source and drain regions being horizontally aligned with the gate.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
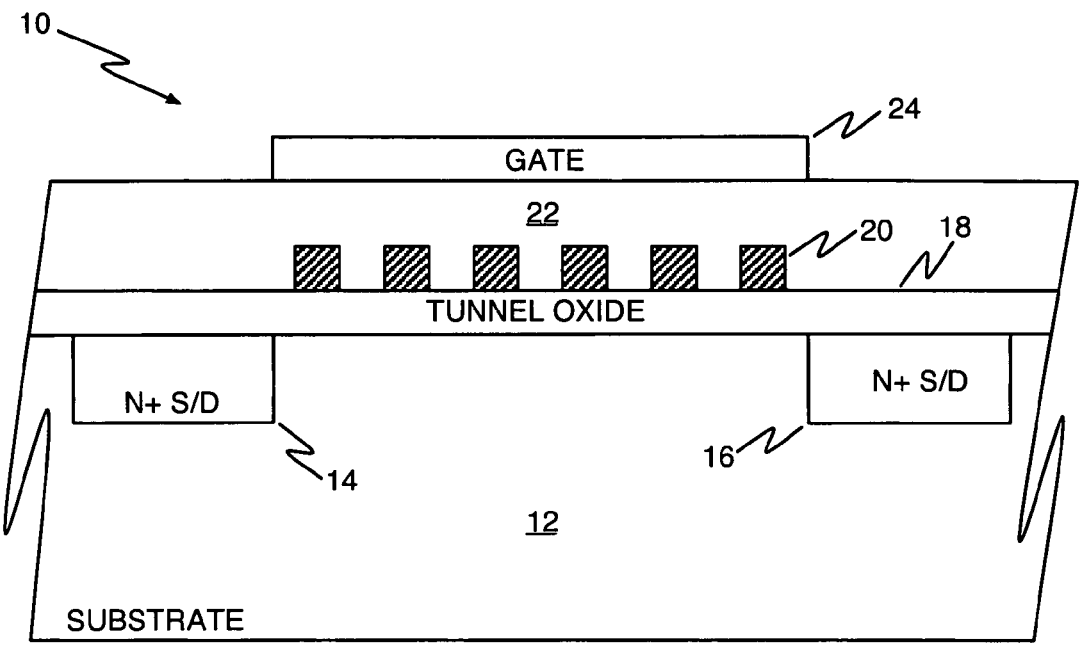
FIG. 1 is a cross-sectional diagram of an illustrative memory cell fabricated according to the present invention.

Referring first to FIG. 1, a cross sectional diagram shows an illustrative isolated-nitride-region non-volatile memory cell 10 according to the present invention. Isolated-nitride-region non-volatile memory cell 10 is formed in a semiconductor substrate 12. Persons of ordinary skill in the art will appreciate that substrate 12 may actually be a well region formed in a semiconductor substrate.

A pair of spaced-apart source/drain regions 14 and 16 define a channel for the isolated-nitride-region non-volatile memory cell 10. A dielectric layer 18, which may be formed from, for example, a high-quality thermal silicon dioxide layer, is disposed over the surface of substrate 12 and serves as a tunnel dielectric layer. The thickness of dielectric layer 18 will determine the programming and erase characteristics of isolated-nitride-region non-volatile memory cell 10 and may be in a range of from about 20 to about 100 angstroms.

A plurality of isolated nitride regions (the right-most one of which is labeled with reference numeral 20) are formed over dielectric layer 18. Nitride regions 20 may be formed from materials such as silicon nitride (SiN) or titanium nitride (TiN) have thicknesses in the range of from about 20 to about 100 angstroms. Nitride regions 20 are encapsulated by dielectric layer 22, which may be formed from materials such as deposited silicon dioxide having a thicknesses in the range of from about 20 to about 100 angstroms.

A gate 24, formed from a material such as doped polysilicon as is known in the art, is disposed over the channel region and is horizontally aligned with the inner edges of source/drain regions 14 and 16 as is known in the art. The gate 24 is covered by an insulating layer (not shown) as is known in the semiconductor art. Contacts (also not shown) are used to make electrical connections to the source/drain regions 14 and 16 and the gate 24 as is well known in the semiconductor art.

Figure 2:
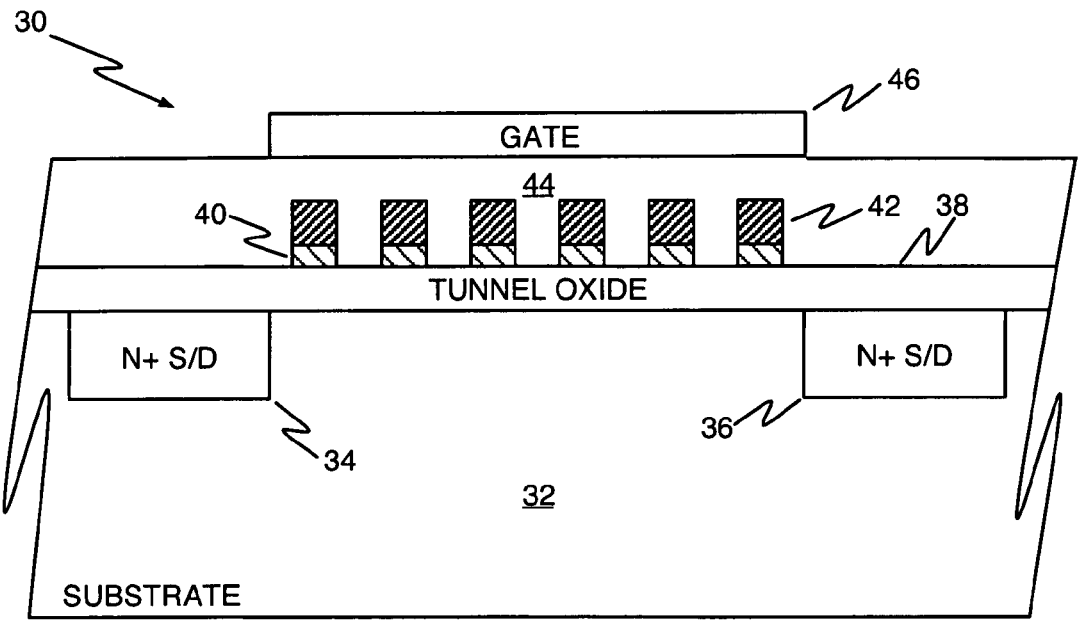
FIG. 2 is a cross-sectional diagram of another illustrative memory cell fabricated according to the present invention.

Referring now to FIG. 2, a cross sectional diagram shows another illustrative isolated-nitride-region non-volatile memory cell 30 according to the present invention. Isolated-nitride-region non-volatile memory cell 30 is formed in a semiconductor substrate 32. As with the embodiment shown in FIG. 1, persons of ordinary skill in the art will appreciate that substrate 32 may actually be a well region formed in a semiconductor substrate.

A pair of spaced-apart source/drain regions 34 and 36 define a channel for the isolated-nitride-region non-volatile memory cell 30. A dielectric layer 38, which may be formed from, for example, a high-quality thermal silicon dioxide layer, is disposed over the surface of substrate 32 and serves as a tunnel dielectric layer. The thickness of dielectric layer 38 will determine the programming and erase characteristics of isolated-nitride-region non-volatile memory cell 30 and may be in a range of from about 20 to about 200 angstroms.

A plurality of isolated regions (the left-most one of which is labeled with reference numeral 40) are disposed over the dielectric layer 38. Isolated regions 40 may be formed from high-temperature metals such as tungsten or titanium, or from doped or undoped silicon or germanium. Isolated regions 40 act to trap charge to alter the surface potential of the device to turn it off and on.

A plurality of isolated nitride regions (the right-most one of which is labeled with reference numeral 42) are formed over and aligned with isolated regions 40. Nitride regions 42 may be formed from materials such as silicon nitride (SiN) or titanium nitride (TiN) have thicknesses in the range of from about 20 to about 100 angstroms. Nitride regions 42 are encapsulated by dielectric layer 44, which may be formed from materials such as deposited silicon dioxide having a thicknesses in the range of from about 20 to about 200 angstroms.

A gate 46, formed from a material such as doped polysilicon as is known in the art, is disposed over the channel region and is horizontally aligned with the inner edges of source/drain regions 34 and 36 as is known in the art. The gate 46 is covered by an insulating layer (not shown) as is known in the semiconductor art. Contacts (also not shown) are used to make electrical connections to the source/drain regions 34 and 36 and the gate 46 as is well known in the semiconductor art.

The programming and erasing techniques used for the isolated-nitride-region non-volatile memory cells 10 and 30 of the present invention are much like the programming and erasing techniques used for programming and erasing nano-crystal or SONOS memory cells. Programming may be accomplished using hot electron injection and erasing may be accomplished using hot hole injection (HHI), sometimes referred to as hot carrier injection (HCI). Fowler-Nordheim tunneling may also be used to program and erase the isolated-nitride-region non-volatile memory cells 10 and 30 of the present invention.

The isolated-nitride-region non-volatile memory cells of the present invention avoid some of the drawbacks of the prior art. First, a defect in the tunnel oxide causing a short circuit between the substrate and one of the isolated nitride regions does not destroy the device, since only an insignificantly small portion of the charge-trapping capability of the device is lost, as opposed to the shorting of the entire floating gate in a conventional floating-gate device. In addition, the drawbacks of employing a single nitride charge-trapping region are avoided, since the nitride charge-trapping takes place in a distributed manner. Finally, the yield problems associated with later thermal cycle damage to nano-crystal regions is avoided.

As will be appreciated by persons of ordinary skill in the art, the programming and erasing potentials used will depend on the layer thicknesses employed in particular isolated-nitride-region non-volatile memory cells 10 and 30. As an illustrative example, isolated-nitride-region non-volatile memory cells 10 and 30 having thicknesses of the lower oxide, the isolated nitride region, and covering oxide of about 100 angstroms may be programmed and erased by using potentials of about 15V across these layers.

Referring now to FIGS. 3A through 3E, a series of cross-sectional diagrams show the progression of processing steps used to fabricate the illustrative structures of the illustrative isolated-nitride-region non-volatile memory cells 10 and 30 of FIGS. 1 and 2. Where applicable, structural elements of FIG. 2 that appear in FIGS. 3A through 3F will be given the same reference numerals as designated in FIG. 2.

Figure 3A:
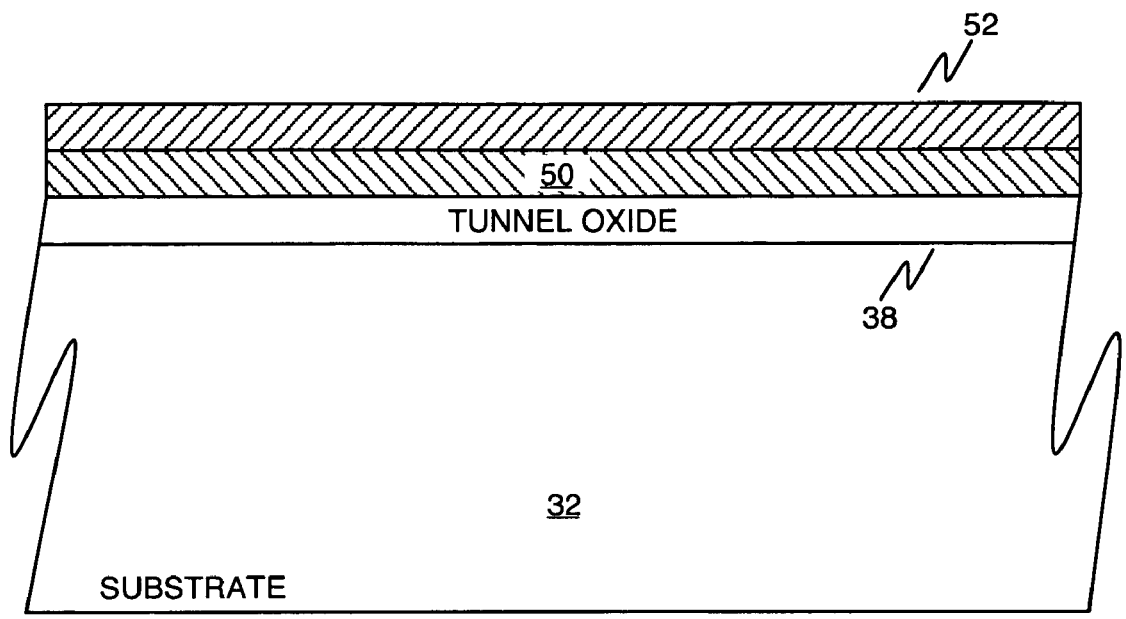
FIGS. 3A through 3F are a series of cross-sectional diagrams illustrating a fabrication process for an isolated-nitride-region non-volatile memory cell according to the present invention.

First, as shown in FIG. 3A, a tunnel dielectric 38 is formed over the surface of substrate 32. As previously noted, dielectric layer 38 may comprise, for example a high-quality thermally-grown layer of silicon dioxide. Typical thicknesses for dielectric layer 38 are in the range of from about 20 to about 100 angstroms.

A blanket layer 50 of a material such as Ti, W, Si, or Ge, may then be formed over the surface of the dielectric layer 38 to a thickness of between about 10 and about 200 angstroms, using conventional materials processing steps. A blanket layer 52 of a nitride, such as SiN or TiN, is then formed over the blanket layer 50 to a thickness of between about 10 and about 100 angstroms, using conventional materials processing steps. Persons of ordinary skill in the art will appreciate that the formation of the blanket layer 50 is optional and that, if the isolated-nitride-region non-volatile memory cell 10 of FIG. 1 is being fabricated, the blanket deposition step for blanket layer 50 may be omitted. FIG. 3A shows the structure resulting from the performance of these process steps.

Figure 3B:
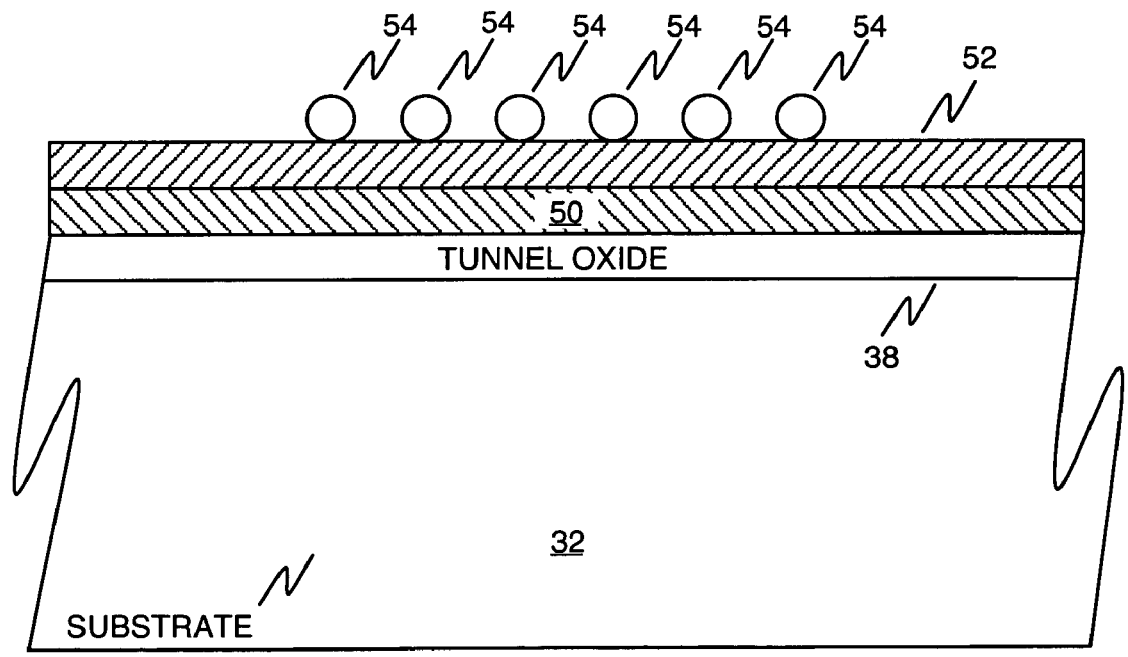

Referring now to FIG. 3B, a plurality of silicon nano-crystals 54 are formed on the surface of blanket nitride layer 52. Formation of silicon nano-crystals 54 may be accomplished in a polysilicon deposition reactor by stopping the growth process before the crystallites have coalesced. FIG. 3B shows the structure resulting after the formation of the silicon nano-crystals.

Figure 3C:
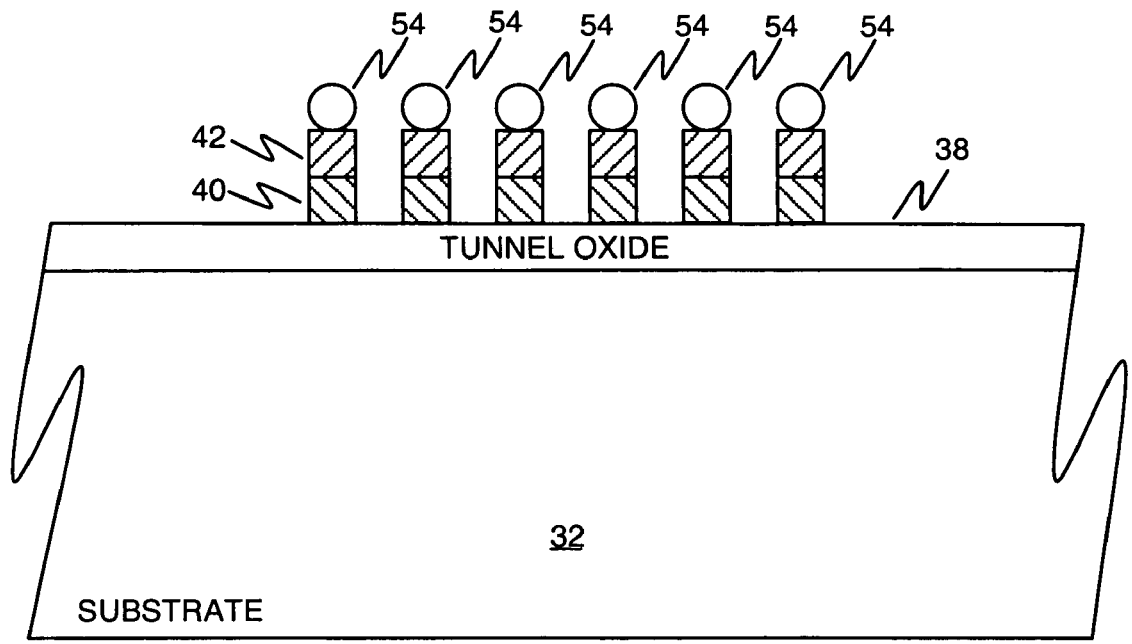

Referring now to FIG. 3C, an etching step is performed to form isolated nitride regions 42 and isolated regions 40, using nano-crystals 54 as a mask and using dielectric layer 38 as an etch stop. This etch may be performed using a standard nitride etch process if only nitride layer 42 is present, and using an etching process selective between layers 40 and 42 and the underlying oxide if both layers 40 and 42 are present. The etch may be performed using a standard nitride etch followed by an etch process selective for the particular material from which layer 30 is made, the etchant being selective to the underlying oxide. FIG. 3C shows the structure resulting after the etching step has been performed.

Figure 3D:
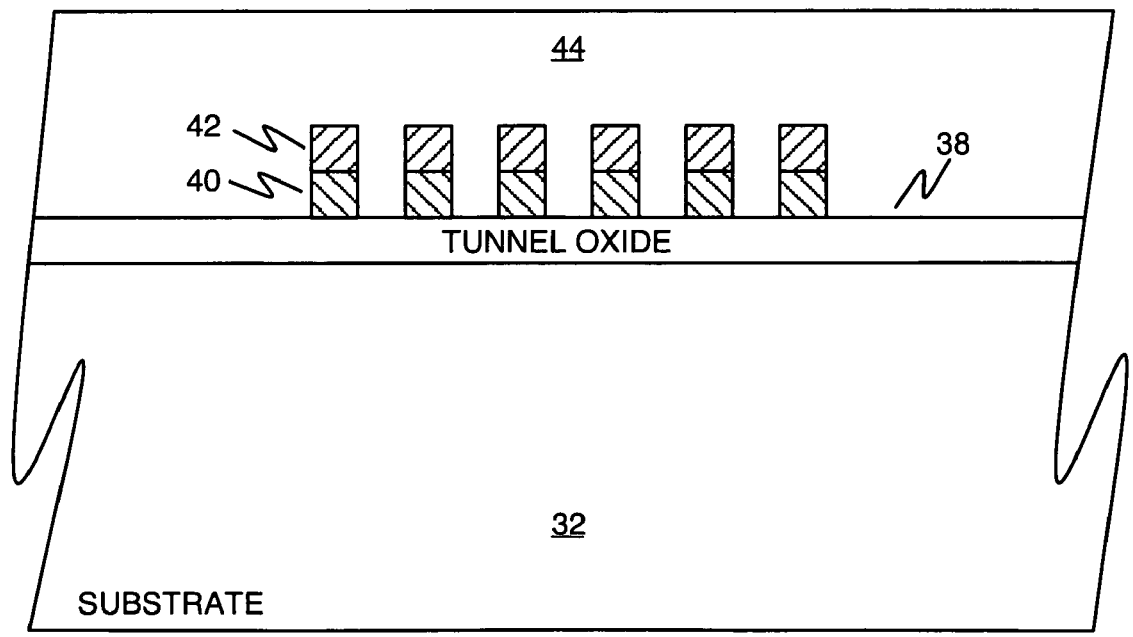

Referring now to FIG. 3D, isolated nitride regions 42 and isolated regions 40 (if present) are encapsulated by forming dielectric layer 44, which may comprise, for example, a layer of deposited silicon dioxide having a thickness in a range of between about 20 and about 200 angstroms The deposited oxide layer 44 may then be thermally oxidized to improve its quality as a gate oxide. FIG. 3D shows the structure resulting after the deposition and oxidation have been performed. Persons of ordinary skill in the art will note that the thermal oxidation step tends to destroy the silicon nano-crystals 54 by oxidizing them. FIG. 3C shows the structure resulting after the thermal oxidation step has been performed, damaging or destroying the nano-crystals 54.

Figure 3E:
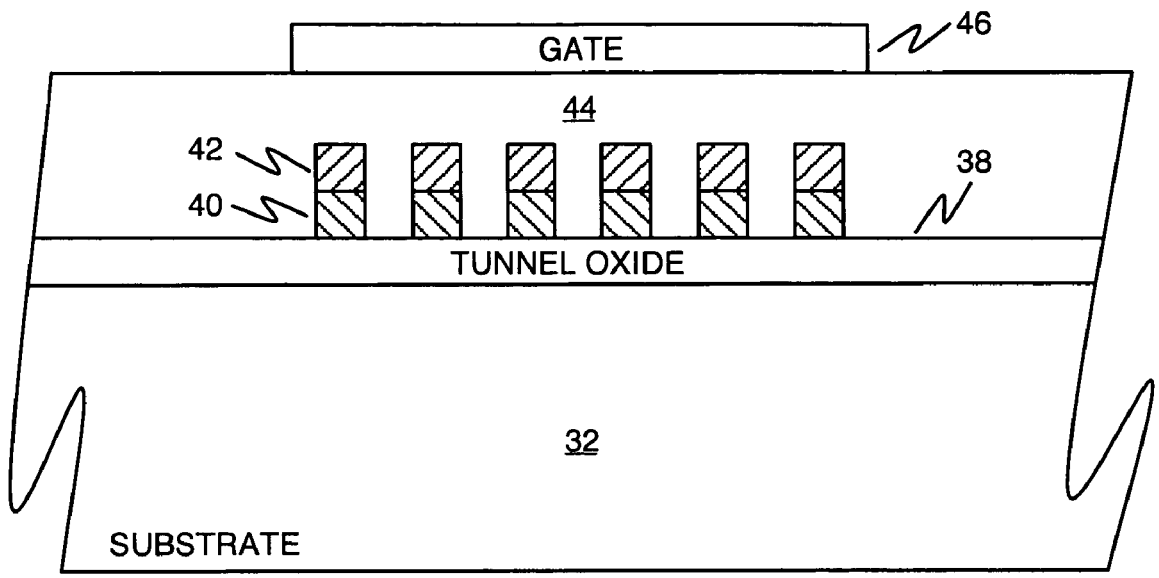

Referring now to FIG. 3E, a layer of polysilicon is formed, doped, and defined to form gate 46 for the isolated-nitride-region non-volatile memory cell. Techniques for polysilicon gate formation are well known in the semiconductor arts. FIG. 3E shows the structure resulting after the gate layer has been deposited, doped and defined to form gate 46.

Figure 3F:
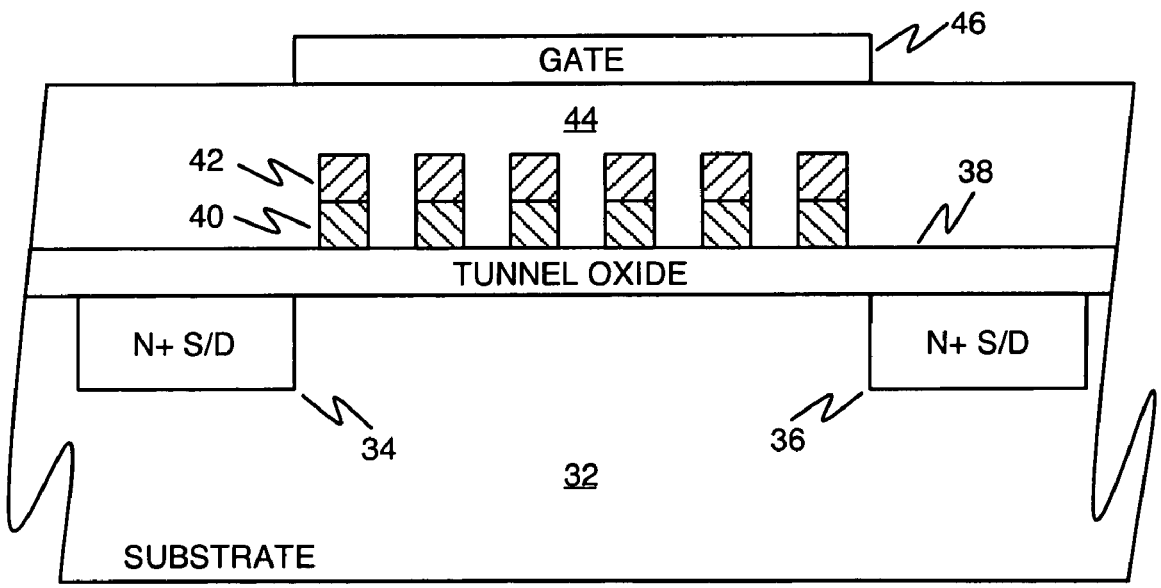

Referring now to FIG. 3F, source/drain regions 34 and 36 are formed, preferably using gate 46 as a mask according to the well-known, self-aligned gate process. At this point in the process, formation of the isolated-nitride-region non-volatile memory cell has been essentially completed. Conventional back end steps including contact formation and passivation (not shown) are then performed to complete the integrated circuit device.

While embodiments and applications of this invention have been shown and described, it would be apparent to those skilled in the art that many more modifications than mentioned above are possible without departing from the inven-

What is claimed is:

1. An isolated-nitride-region non-volatile memory cell comprising:
   a semiconductor substrate;
   spaced-apart source and drain regions disposed in the semiconductor substrate forming a channel therebetween;
   a tunnel dielectric layer disposed over the semiconductor substrate;
   a plurality of isolated regions disposed over the tunnel dielectric layer, the isolated regions formed from one of a high-temperature metal and a semiconductor material;
   a plurality of isolated nitride charge-trapping regions disposed over, in contact with, and in vertical alignment with the isolated regions;
   an insulating layer disposed over and between the plurality of isolated regions and isolated nitride charge-trapping regions; and
   a control gate disposed above the insulating layer.

2. The isolated-nitride-region non-volatile memory cell of claim 1 wherein the plurality of isolated nitride charge-trapping regions comprise a metal nitride.

3. The isolated-nitride-region non-volatile memory cell of claim 1 wherein the isolated nitride charge-trapping regions comprise one of TiN and SiN.

4. The isolated-nitride-region non-volatile memory cell of claim 1 further including a plurality of isolated silicon nano-crystal regions isolated from the gate, each isolated silicon nano-crystal region disposed over and in electrical contact with one of the isolated nitride regions.

5. The isolated-nitride-region non-volatile memory cell of claim 1 wherein the isolated regions comprise a high-temperature metal.

6. The isolated-nitride-region non-volatile memory cell of claim 1 wherein the isolated regions comprise one of tungsten and titanium.

7. The isolated-nitride-region non-volatile memory cell of claim 1 wherein the isolated regions comprise a semiconductor material.

8. The isolated-nitride-region non-volatile memory cell of claim 1 wherein the isolated regions comprise one of silicon and germanium.

* * * * *